United States Patent
Choi (10) Patent No.: US 8,456,921 B2
(45) Date of Patent: Jun. 4, 2013

(54) NONVOLATILE MEMORY AND OPERATION METHOD OF THE SAME

(75) Inventor: Won-Beom Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/177,983

(22) Filed: Jul. 7, 2011

(65) Prior Publication Data

US 2012/0008417 A1    Jan. 12, 2012

(30) Foreign Application Priority Data

Jul. 7, 2010    (KR) .......................... 10-2010-0065390

(51) Int. Cl.
*G11C 11/34*    (2006.01)

(52) U.S. Cl.
USPC ................................ 365/185.25; 365/230.04

(58) Field of Classification Search
USPC ................................ 365/185.25, 203, 230.04
See application file for complete search history.

(56) References Cited

U.S. PATENT DOCUMENTS

| 6,639,842 | B1 * | 10/2003 | Hoang et al. | ............. | 365/185.28 |
| 7,239,556 | B2 * | 7/2007 | Abe et al. | ................. | 365/185.33 |
| 2008/0151633 | A1 * | 6/2008 | Park et al. | ................ | 365/185.19 |

FOREIGN PATENT DOCUMENTS

KR    1020060095655    9/2006

OTHER PUBLICATIONS

Notice of Preliminary Rejection issued from Korean Intellectual Property Office on Aug. 30, 2011.

* cited by examiner

*Primary Examiner* — Douglas King
(74) *Attorney, Agent, or Firm* — IP & T Group LLP (57) ABSTRACT

A nonvolatile memory includes a first bit line coupled to a first cell string, a second bit line coupled to a second cell string, and a bit line precharge unit configured to precharge the first bit line and the second bit line before a program operation. A bit line selected from among the first bit line and the second bit line is precharged to a lower voltage level than a target voltage level, and an unselected bit line is precharged to the target voltage level.

11 Claims, 7 Drawing Sheets

NONVOLATILE MEMORY AND OPERATION METHOD OF THE SAME

CROSS-REFERENCE TO RELATED APPLICATIONS

The present application claims priority of Korean Patent Application No. 10-2010-0065390, filed on Jul. 7, 2010, which is incorporated herein by reference in its entirety.

BACKGROUND

1. Field of the Invention

Exemplary embodiments of the present invention relate to a nonvolatile memory and an operation method of the same.

2. Description of the Related Art

Memory devices are divided into volatile memory devices and nonvolatile memory devices, depending on whether or not data stored therein are maintained when power supply is cut off. More specifically, the data stored in volatile memory devices are erased when power supply is cut off. Volatile memory devices may include DRAM and SRAM. In contrast, the data stored in nonvolatile memory devices are maintained even though power supply is cut off. An example of a nonvolatile memory device is a flash memory device.

Figure 1:
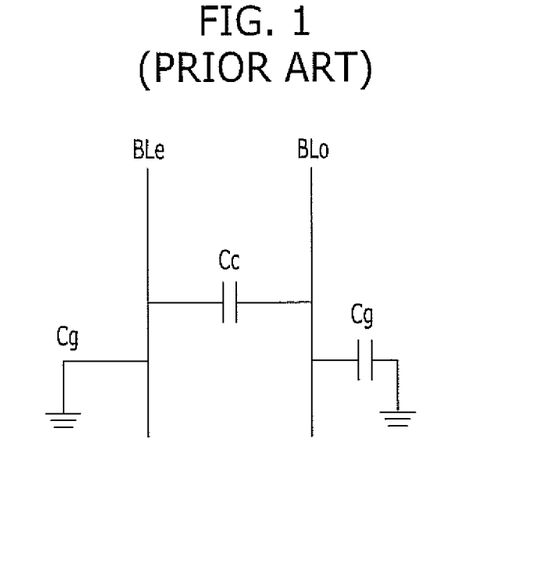
FIG. 1 is a diagram illustrating parasitic capacitances occurring in a bit line of a nonvolatile memory.

FIG. 1 is a diagram illustrating parasitic capacitances occurring in a bit line of a nonvolatile memory.

Referring to FIG. 1, a coupling capacitor Cc is formed by coupling occurring between an even bit line BLe and an odd bit line BLo. Furthermore, a ground capacitor Cg is formed by coupling occurring between the even bit line BLe and a ground, and another ground capacitor Cg is formed by coupling occurring between the odd bit line BLo and a ground. In general, the coupling capacitor Cc formed by the coupling occurring between the bit lines BLe and BLo is about nine times larger than the ground capacitor Cg formed by the coupling occurring between the bit lines BLe and BLo and the ground.

Figure 2A:
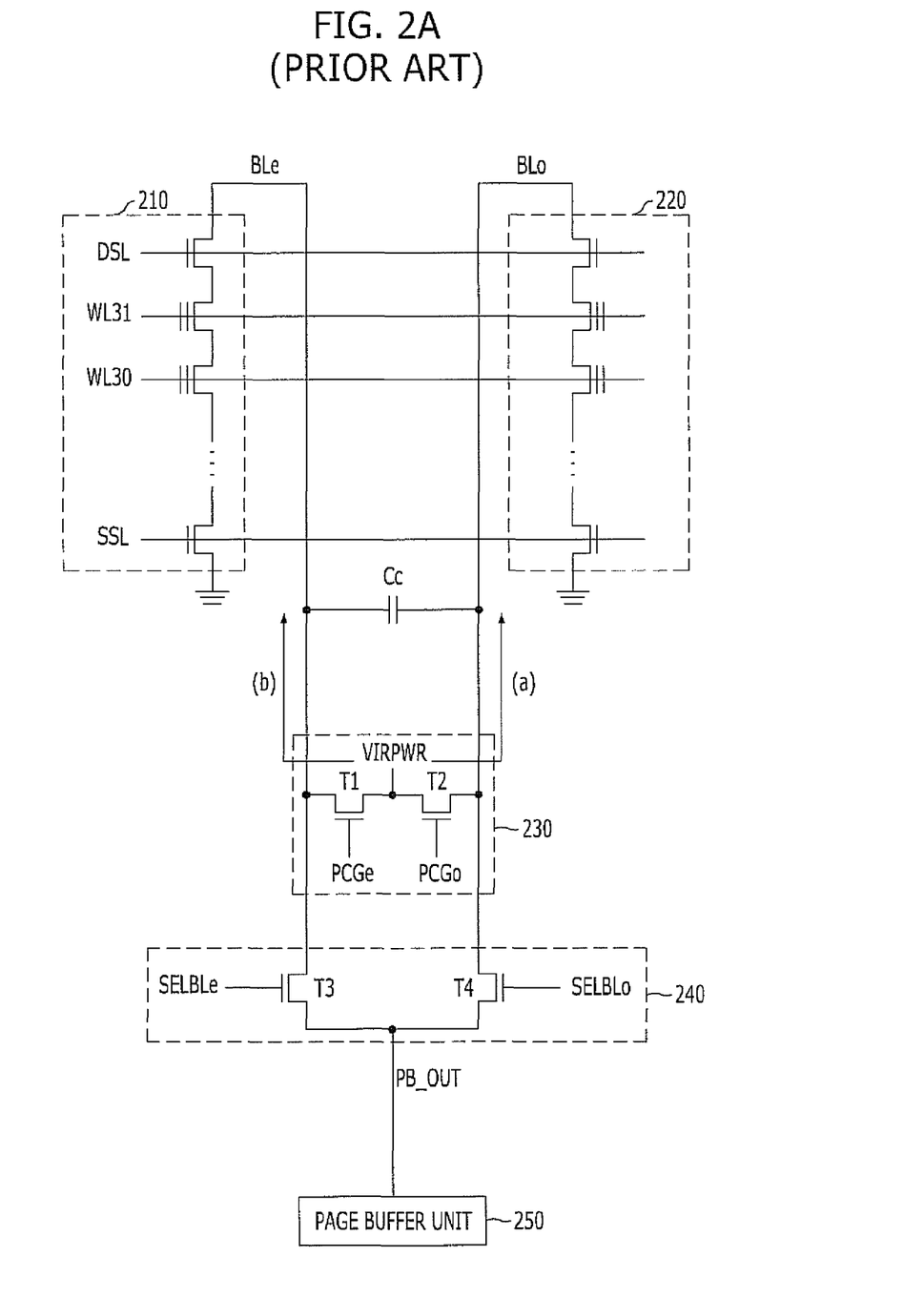
FIGS. 2A and 2B are diagrams illustrating a process in which a bit line is precharged and recovered in a conventional nonvolatile memory before a program operation.
Figure 2B:
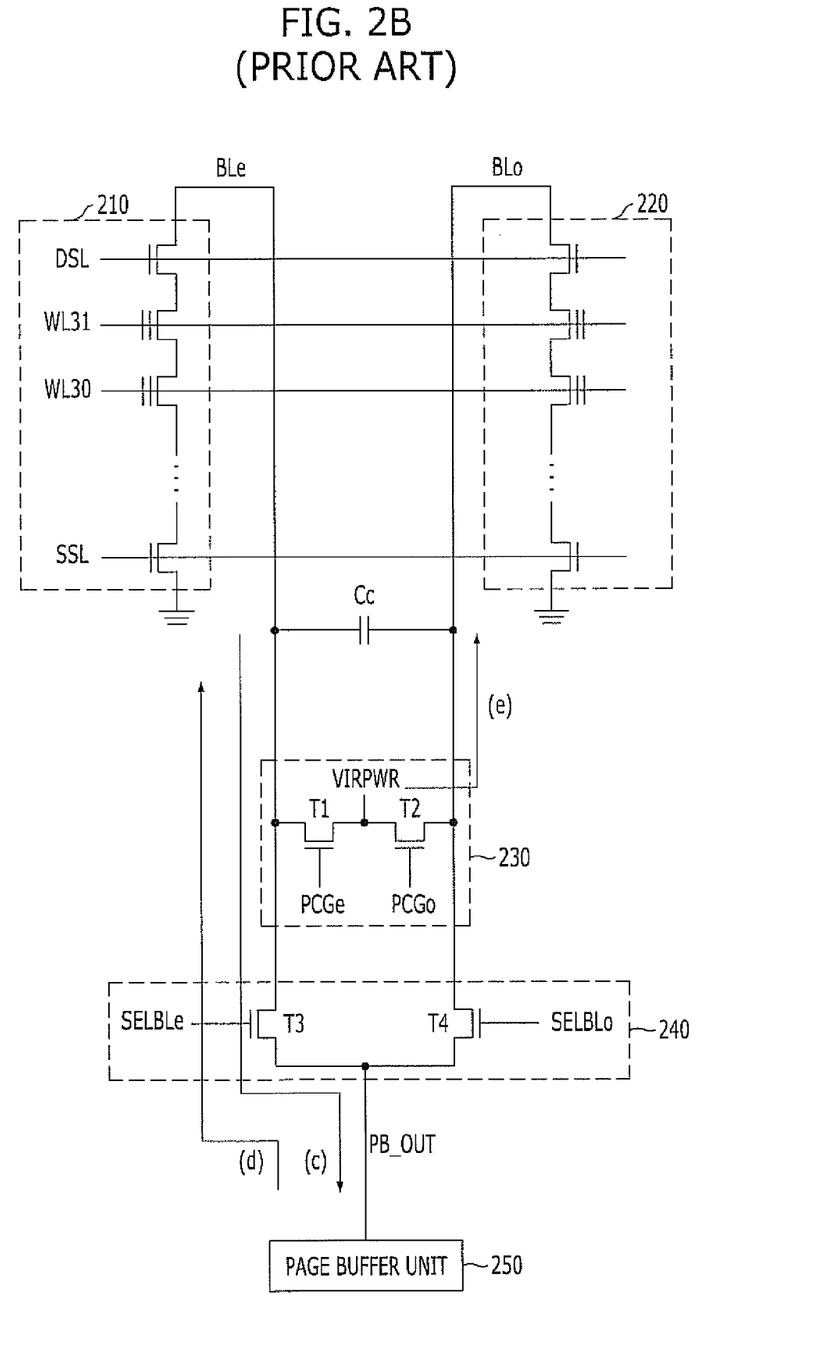

FIGS. 2A and 2B are diagrams illustrating a process in which a bit line is precharged and recovered in a conventional nonvolatile memory before a program operation.

Referring to FIG. 2A, an even bit line BLe and an odd bit line BLo are coupled to corresponding cell strings 210 and 220, respectively. Furthermore, a bit line precharge unit 230 is provided to precharge the even bit line BLe and the odd bit line BLo. Furthermore, a bit line selection unit 240 is configured to electrically couple a bit line selected between the even bit line BLe and the odd bit line BLo to a page buffer unit 250.

Referring to FIG. 2A, a process in which the bit lines BLe and BLo are precharged will be described. First, an even precharge signal PCGe and an odd precharge signal PCGo become a high level to turn on transistors T1 and T2, and a precharge voltage applied to a virtual power terminal VIR-PWR is supplied to the even bit line BLe and the odd bit line BLo. In FIG. 2A, arrows (a) and (b) indicate that currents are supplied to the bit lines BLe and BLo. In this case, since the even bit line BLe and the odd bit line BLo are simultaneously precharged, influence caused by a coupling capacitor Cc is not significant.

Referring to FIG. 2B, after the bit lines BLe and BLo are precharged, a bit line which is selected between the even bit line BLe and the odd bit line BLo, so as to be controlled by the page buffer unit 250, is electrically coupled to an output node PB_OUT of the page buffer unit 250, and an unselected bit line maintains the same state as the previous state (e.g., a precharged state). During an even page operation, the even bit line BLe becomes the selected bit line, and during an odd page operation, the odd bit line BLo becomes the selected bit line. Hereafter, it is assumed that the even bit line BLe is the selected bit line. Since the even bit line BLe is the selected bit line, an even selection signal SELe is activated to a high level, and an odd selection signal SELo is deactivated to a low level. Furthermore, the even precharge signal PCGe is deactivated to a low level, and the odd precharge signal PCGo maintains a state in which it is activated to a high level.

The output node PB_OUT of the page buffer unit 250 has a voltage level which is changed by inputted data. When the inputted data is program data (data which is to program a memory cell), the voltage level of the output node PB_OUT becomes a low level. When the inputted data is not program data, that is, when the inputted data is inhibition data, the voltage level of the output node PB_OUT becomes a high level. Therefore, the directions of currents flowing in the bit lines BLe and BLo, respectively, may be set as described in the following two cases—cases (1) and (2)—.

Case (1): Since the output node PB_OUT of the page buffer 250 becomes a low level when the inputted data is program data, the current of the selected bit line BLe flows in a direction (c), and the selected bit line BLe is discharged to a low level. Meanwhile, the current of the unselected bit line BLo flows in a direction (e). In this case, the currents of the selected bit line BLe and the unselected bit line BLo flow in the opposite directions. This has the effect of charging the coupling capacitor Cc. During this period, a relatively large peak current may be consumed.

Case (2): Since the output node PB_OUT of the page buffer becomes a high level when the inputted data is not program data, the current of the selected bit line BLe flows in a direction (d), and the current of the unselected bit line BLo flows in the direction (e). In this case, since the currents of the selected bit line BLe and the unselected bit line BLo flow in the same direction, a large peak current may not be consumed.

Although only one page coupled to one even bit line and one odd bit line is shown in FIGS. 2A and 2B, the above-described case (1) may occur simultaneously in all the even and odd bit lines BLe and BLo of the nonvolatile memory device. In this case, when currents flow in directions to charge a large number of coupling capacitors Cc, a large number of peak currents may be consumed inside the nonvolatile memory. The period in which case (1) takes place may represent a period in which the largest peak current is consumed in the entire operation of the nonvolatile memory. At this time, the power of the nonvolatile memory may be destabilized by an excessive peak current. As a result, an operation fail may occur.

SUMMARY

Exemplary embodiments of the present invention are directed to a structure and method for reducing a peak current of a nonvolatile memory.

In accordance with an exemplary embodiment of the present invention, a nonvolatile memory includes a first bit line coupled to a first cell string, a second bit line coupled to a second cell string, and a bit line precharge unit configured to precharge the first bit line and the second bit line before a program operation. A bit line selected from among the first bit line and the second bit line is precharged to a lower voltage level than a target voltage level, and an unselected bit line is precharged to the target voltage level.

The nonvolatile memory may further include a page buffer unit configured to control the selected bit line to be discharged when data of the selected bit line is program data, and control the selected bit line to be precharged to the target voltage level when the data of the selected bit line is not program data, during the program operation.

The bit line precharge unit may include a first transistor configured to transfer a precharge voltage to the first bit line in response to a first precharge signal, and a second transistor configured to transfer the precharge voltage to the second bit line in response to a second precharge signal. During a precharge operation, a precharge signal corresponding to the selected bit line from among the first precharge signal and the second precharge signal may have a lower voltage level than a precharge signal corresponding to the unselected bit line.

In accordance with another exemplary embodiment of the present invention, an operation method of a nonvolatile memory includes precharging a first bit line and a second bit line, wherein a bit line selected from among the first bit line and the second bit line is precharged to a lower voltage level than a target voltage level, and an unselected bit line is precharged to the target voltage level, and discharging the selected bit line when data of the selected bit line is program data, and precharging the selected bit line to the target voltage level when the data of the selected bit line is not program data.

In the precharging of the first bit line and the second bit line, the selected bit line may be precharged to a voltage within the range of the target voltage level*($2/5$) to the target voltage level*($3/5$).

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
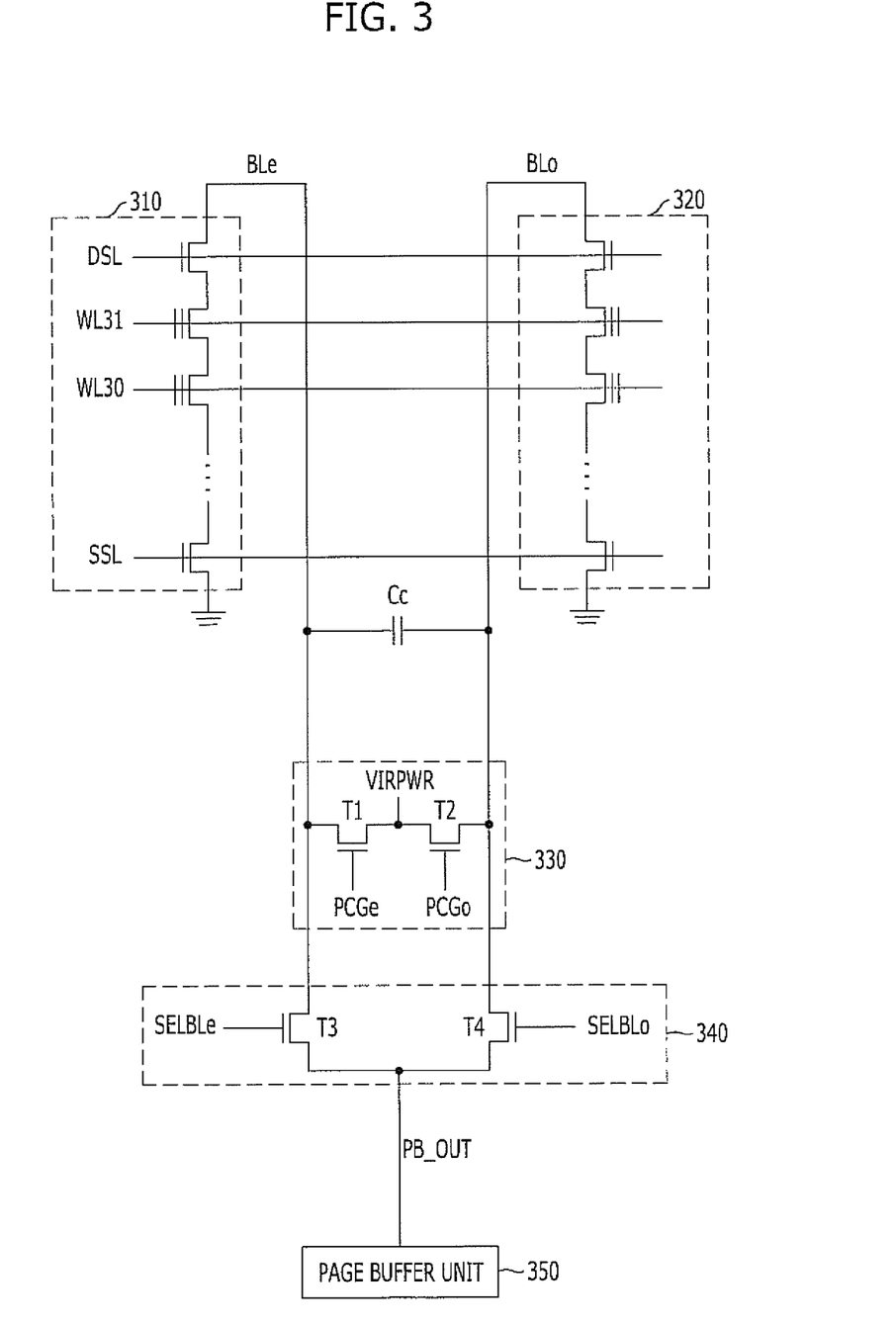
FIG. 3 is a diagram illustrating the configuration of a nonvolatile memory in accordance with an exemplary embodiment of the present invention.

FIG. 3 is a diagram illustrating the configuration of a nonvolatile memory in accordance with an exemplary embodiment of the present invention.

Referring to FIG. 3, the nonvolatile memory includes an even bit line BLe, an odd bit line BLo, a bit line precharge unit 330, a page buffer unit 350, and a bit line selection unit 340.

The even bit line BLe is a bit line coupled to an even cell string 310, and the odd bit line BLo is a bit line coupled to an odd cell string 320. During an operation of an even page, the even cell string 310 may be programmed, and during an operation of an odd page, the odd cell string 320 may be programmed.

The bit line precharge unit 330 is configured to precharge the even bit line BLe and the odd bit line BLo before a program operation. In the conventional nonvolatile memory of FIG. 2, the precharge unit 230 precharges the even bit line BLe and the odd bit line BLo to the same voltage level. However, the bit line precharge unit 330 in accordance with an exemplary embodiment of the present invention precharges an unselected bit line from among the even bit line BLe and the odd bit line BLo to a target voltage level, for example, VCC, and precharges the selected bit line to a lower voltage level than the target voltage level. Here, the lower voltage level may be a voltage level corresponding to $1/2$ of the target voltage level. However, the lower voltage level may be any voltage level lower than the target voltage level. But, the lower voltage level is preferably within the range of the target voltage level*($2/5$) to the target voltage level*($3/5$). Furthermore, the bit line precharge unit 330 cuts off a current path to the selected bit line after the precharge operation (e.g., during the program operation), and maintains only a current path to the unselected bit line. The selected bit line is the even bit line BLe during an even page operation, and the odd bit line BLo during an odd page operation.

The bit line precharge unit 330 may include a first transistor T1 and a second transistor T2. The first transistor T1 is configured to transfer a precharge voltage, which is applied to a virtual power terminal VIRPWR, to the even bit line BLe in response to an even precharge signal PCGe, and the second transistor T2 is configured to transfer the precharge voltage, which is applied to the virtual power terminal VIRPWR, to the odd bit line BLo in response to an odd precharge signal PCGo. The precharge signal corresponding to the selected bit line during the precharge operation has a lower voltage level than the precharge signal corresponding to the unselected bit line. Accordingly, a transistor supplying a current to the selected bit line is more weakly turned on than a transistor supplying a current to the unselected bit line, and thus, the selected bit line may be precharged to a lower level than the target value. For example, when the even bit line BLe is the selected bit line, the even precharge signal PCGe has a lower voltage level than the odd precharge signal PCGo during the precharge operation. Herein, the first and second transistors T1 and T2 may be NMOS transistors.

The bit line selection unit 340 is configured to couple the selected bit line to an output node PB_OUT of the page buffer unit 350 during a program operation. That is, during an even page operation, an even selection signal SELBLe is activated to turn on a transistor T3, and during an odd page operation, an odd selection signal SELBLo is activated to turn on a transistor T4. Herein, the third and fourth transistors T3 and T4 may also be NMOS transistors.

The page buffer unit 350 is configured to set the output node PB_OUT to a high voltage level (e.g., a VCC level) when the inputted data is program data (data which is to program a memory cell), and to set the output node PB_OUT to a low voltage level (ground level) when the inputted data is not program data (data which does not program a memory cell). Therefore, during the program operation, the selected bit line coupled to the output node PB_OUT is precharged to a high voltage level or discharged to a low voltage level by the page buffer unit 350.

Figure 4A:
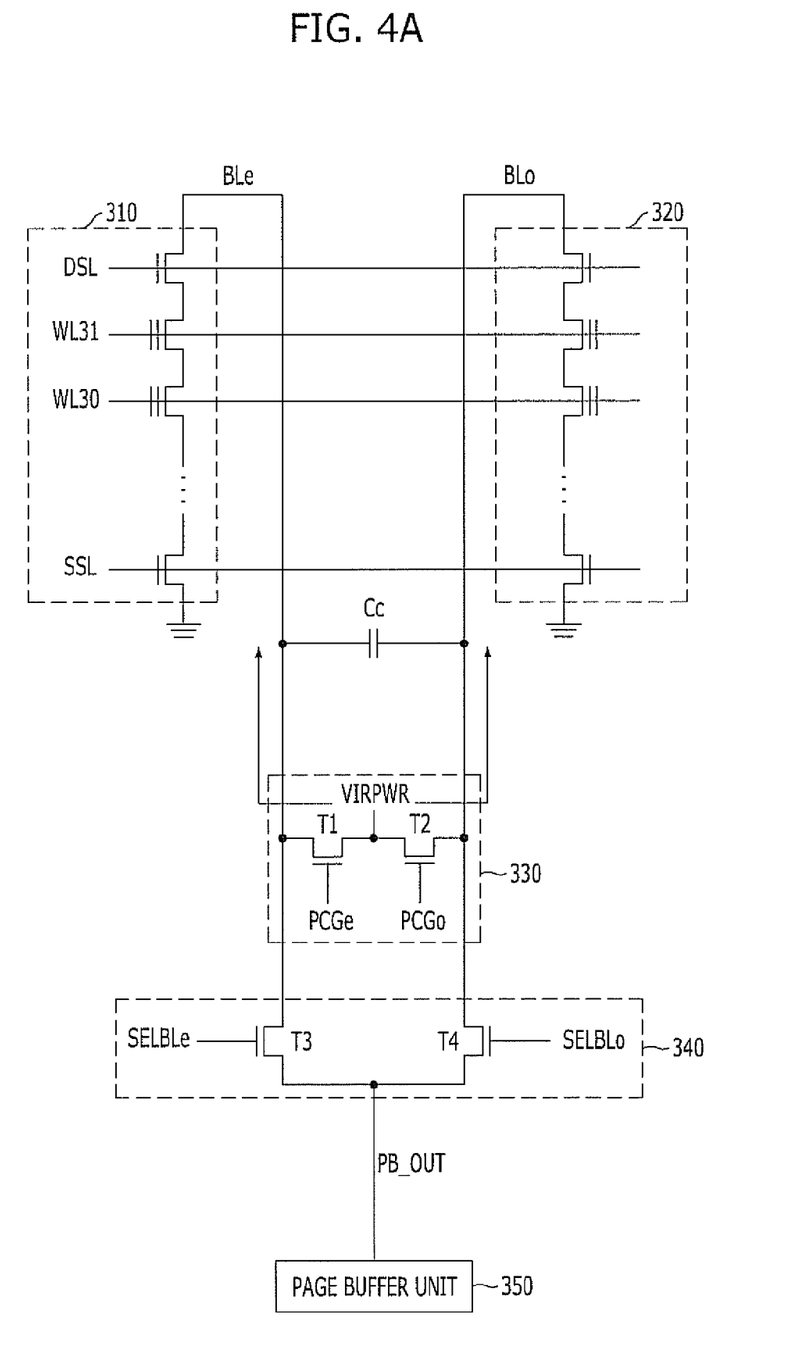
FIGS. 4A to 4C are diagrams illustrating the operation of the nonvolatile memory in accordance with an exemplary embodiment of the present invention.
Figure 4B:
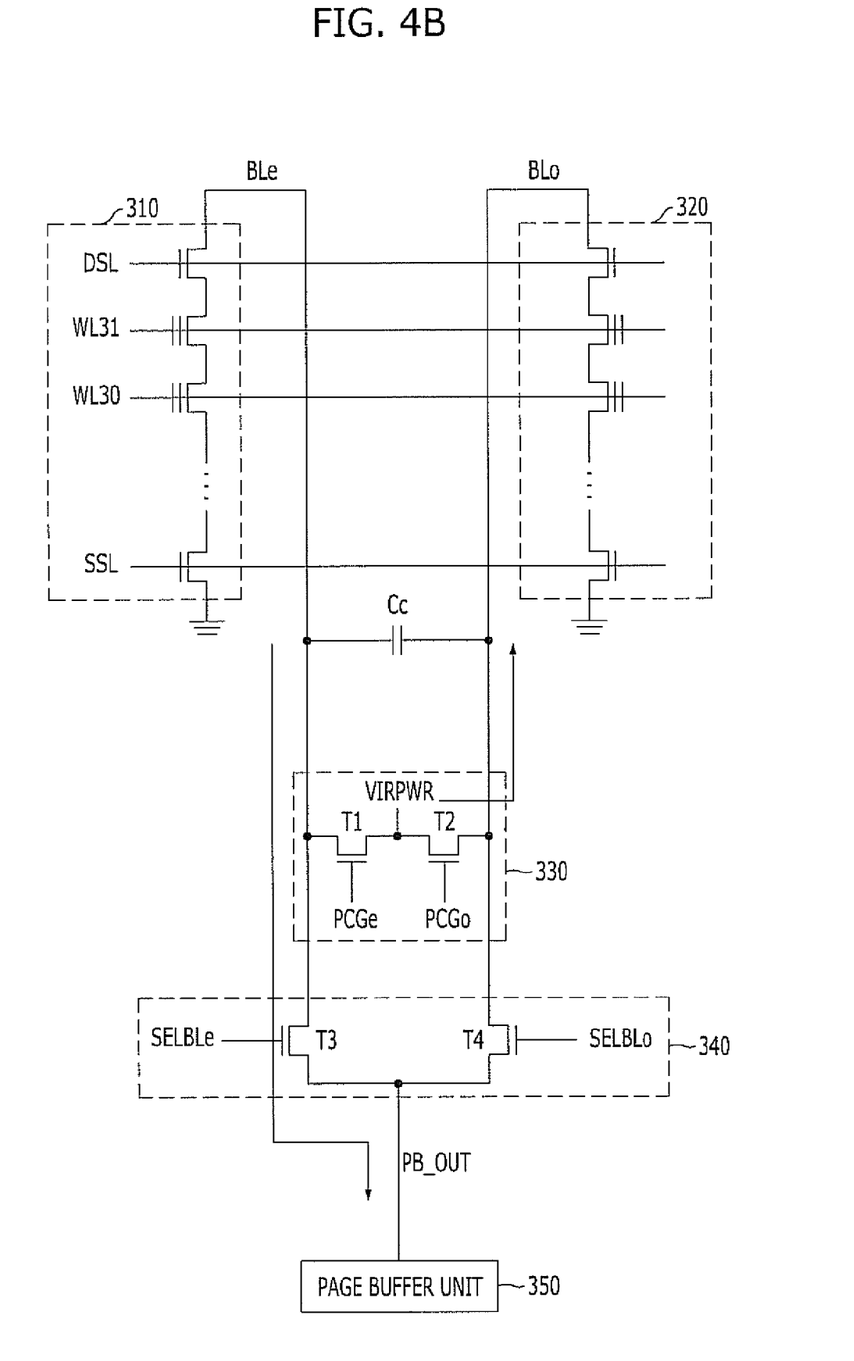
Figure 4C:
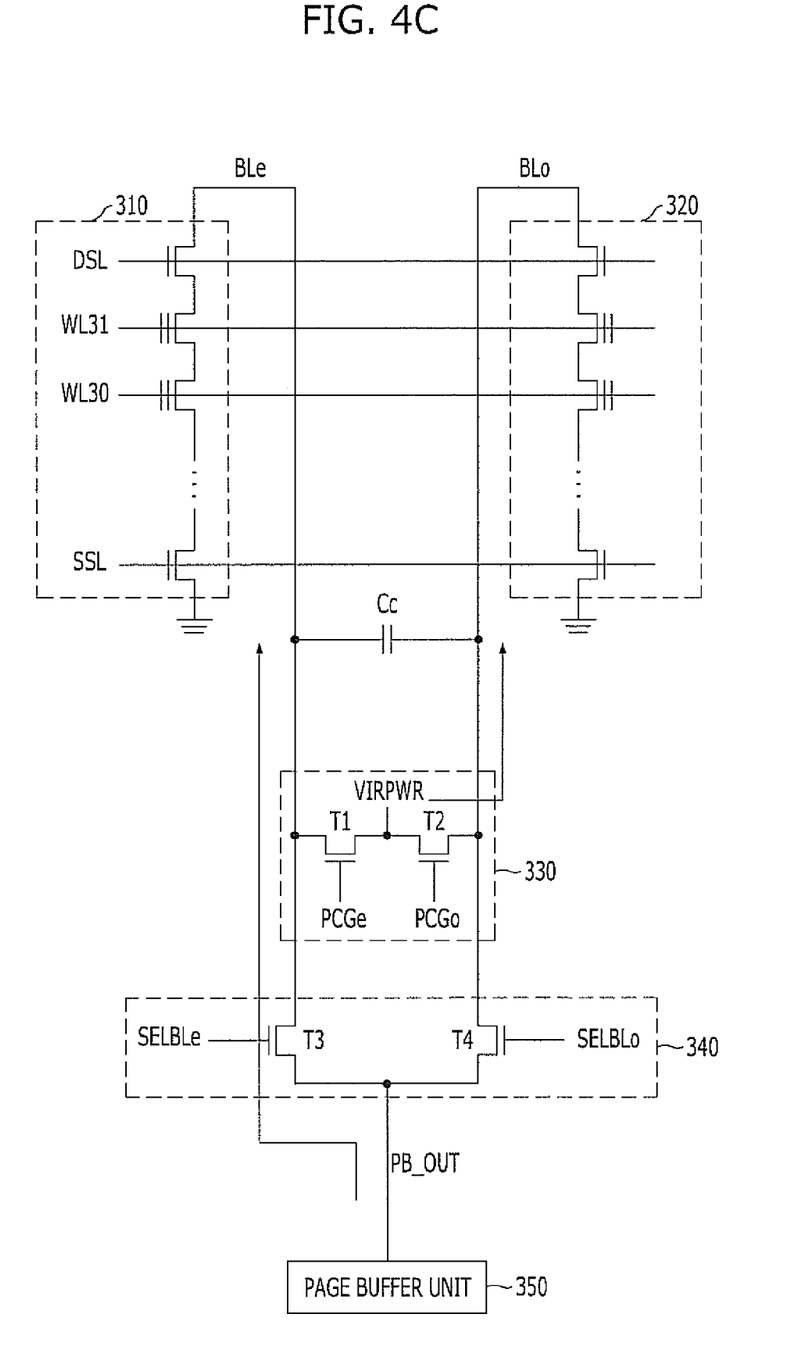

FIGS. 4A to 4C are diagrams illustrating the operation of the nonvolatile memory in accordance with an exemplary embodiment of the present invention. Referring to FIGS. 4A to 4C, the operation of the nonvolatile memory will be described. In the following descriptions, it is assumed that the even bit line BLe is a selected bit line and the odd bit line BLo is an unselected bit line. In FIGS. 4A to 4C, Cc represents a coupling capacitor formed by coupling occurring between an even bit line BLe and an odd bit line BLo.

FIG. 4A illustrates a process in which a bit line is precharged before a program operation. Referring to FIG. 4A, the bit line precharge unit 330 precharges both the selected bit line BLe and the unselected bit line BLo. The precharge signal PCGe of the selected bit line BLe has a lower voltage level than the precharge signal PCGo of the unselected bit line BLo. The lower voltage level is a voltage level that weakly turns on a transistor. Therefore, the transistor T1 is more weakly turned on than the transistor T2. Accordingly, the selected bit line BLe may be precharged to a level corresponding to a target voltage level of VCC*(½), while the unselected bit line BLo may be precharged to a target voltage level of VCC. At this time, both the selected bit line BLe and the unselected bit line BLo are not coupled to the page buffer unit 350. That is, the third and fourth transistors T3 and T4 are both in an off state. In FIG. 4A, arrows indicate paths through which current flows.

FIG. 4B illustrates a program operation when program data is inputted. When program data is inputted, the output node PB_OUT of the page buffer unit 350 has a low voltage level (e.g., a ground voltage level GND), and is coupled to the selected bit line BLe. Therefore, the selected bit line BLe is discharged to a low voltage level by the page buffer unit 350. Meanwhile, the odd precharge signal PCGo continuously maintains an activation state. Therefore, although the voltage level of the selected bit line BLe decreases, the voltage level of the unselected bit line BLo is maintained at the target voltage level of VCC. In FIG. 4B, arrows indicate paths through which current flows.

During the operation of FIG. 4B, the selected bit line BLe precharged to ½ of the target voltage level of VCC is discharged, and the unselected bit line BLo precharged to the target voltage level VCC continuously maintains the target voltage level VCC. In this case, although a current is consumed by the coupling capacitor Cc, the selected bit line BLe is not discharged to a ground voltage from the target value VCC as in the conventional nonvolatile memory. Instead, the selected bit line BLe is discharged to the ground voltage from target voltage level of VCC*(½). Therefore, the current consumption may be reduced to half of the current consumption of the conventional nonvolatile memory. In the conventional nonvolatile memory, the largest peak current is typically consumed during the operation period of FIG. 4B. In this exemplary embodiment, however, concerns regarding the peak current may be alleviated by reducing the power consumption.

FIG. 4C illustrates a program operation when data which is not program data is inputted. When data which is not program data is inputted, the output node PB_OUT of the page buffer unit 350 has a high voltage level VCC, and is coupled to the selected bit line BLe. Therefore, the selected bit line BLe is precharged to the same value as the target voltage level VCC by the page buffer unit 350. In this case, since the selected bit line BLe maintains a high voltage level, memory cells within the cell string 310 coupled to the selected bit line BLe are not programmed. In other words, the memory cells are program-inhibited. Meanwhile, since the odd precharge signal BLo continuously maintains an activated level, the unselected bit line BLo continuously maintains the target voltage level of VCC.

In accordance with an exemplary embodiment of the present invention, the selected bit line is partially precharged by the bit line precharge unit, and then discharged or completely precharged by the page buffer unit. Therefore, the current consumption of the nonvolatile memory may be dispersed, and the peak current of the nonvolatile memory may be reduced.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory comprising:
a first bit line coupled to a first cell string;
a second bit line coupled to a second cell string; and
a bit line precharge unit configured to precharge the first bit line and the second bit line before a program operation, wherein a bit line selected from among the first bit line and the second bit line is precharged to a lower voltage level than a target voltage level, and an unselected bit line is precharged to the target voltage level,
wherein the bit line precharge unit comprises:
a first transistor configured to transfer a precharge voltage to the first bit line in response to a first precharge signal; and
a second transistor configured to transfer the precharge voltage to the second bit line in response to a second precharge signal, and
wherein, during a precharge operation, a precharge signal corresponding to the selected bit line from among the first precharge signal and the second precharge signal has a lower voltage level than a precharge signal corresponding to the unselected bit line.

2. The nonvolatile memory of claim 1, further comprising a page buffer unit configured to control the selected bit line to be discharged when data of the selected bit line is program data, and control the selected bit line to be precharged to the target voltage level when the data of the selected bit line is not program data, during the program operation.

3. The nonvolatile memory of claim 2, further comprising a bit line selection unit configured to electrically couple the page buffer unit to the selected bit line.

4. The nonvolatile memory of claim 3, wherein the bit line selection unit comprises:
a third transistor configured to electrically couple the first bit line to the page buffer unit in response to a first bit line selection signal; and
a fourth transistor configured to electrically couple the second bit line to the page buffer unit in response to a second bit line selection signal.

5. The nonvolatile memory of claim 2, wherein the bit line precharge unit precharges the selected bit line to a voltage within the range of the target voltage level*(⅔) to the target voltage level*(⅗).

6. The nonvolatile memory of claim 1, wherein during a program operation, a precharge signal corresponding to the unselected bit line from among the first precharge signal and the second precharge signal maintains an activation voltage level.

7. The nonvolatile memory of claim 1, wherein the first bit line and the second bit line are adjacent bit lines.

8. An operation method of a nonvolatile memory, comprising:
precharging a first bit line and a second bit line, wherein a bit line selected from among the first bit line and the second bit line is precharged to a lower voltage level than a target voltage level, and an unselected bit line is precharged to the target voltage level; and
discharging the selected bit line when data of the selected bit line is program data, or precharging the selected bit line to the target voltage level when the data of the selected bit line is not program data, wherein the prechargina of the first bit line and the second bit line comprises:

applying a first precharge signal to a gate of a first transistor to electrically couple the selected bit line with a precharge voltage terminal; and applying a second precharge signal, having a voltage level higher than that of the first precharge signal, to a gate of a second transistor to electrically couple the unselected bit line with the precharge voltage terminal.

9. The method of claim 8, wherein, in the precharging of the first bit line and the second bit line, the selected bit line is precharged to a voltage within the range of the target voltage level*(2/5) to the target voltage level*(3/5).

10. The method of claim 8, wherein, in the discharging of the selected bit line, the unselected bit line continuously maintains the target voltage level obtained by the precharging of the first bit line and the second bit line.

11. A nonvolatile memory comprising:

an even bit line configured to be coupled to an even cell string;

an odd bit line configured to be coupled to an odd cell string; a first transistor configured to transfer a precharge voltage to the even bit line in response to an even precharge signal; and a second transistor configured to transfer the precharge voltage to the odd bit line in response to an odd precharge signal, wherein, during a precharge operation, a precharge signal corresponding to the selected bit line from among the even precharge signal and the odd precharge signal has a lower voltage level than a precharge signal corresponding to the unselected bit line.

* * * * *